United States Patent [19]

Marschall et al.

[11] 4,359,775
[45] Nov. 16, 1982

[54] SEMICONDUCTOR LASER

[75] Inventors: Peter Marschall, Neu-Ulm; Klaus Petermann, Blaustein/Herrlingen; Ewald Schlosser; Hans-Peter Vollmer, both of Ulm; Claus Wölk, Erbach, all of Fed. Rep. of Germany

[73] Assignee: Licentia Patent-Verwaltungs-G.m.b.H., Frankfurt am Main, Fed. Rep. of Germany

[21] Appl. No.: 178,568

[22] Filed: Aug. 15, 1980

[30] Foreign Application Priority Data

Aug. 16, 1979 [DE] Fed. Rep. of Germany ....... 2933035

[51] Int. Cl.³ ............................... H01S 3/19
[52] U.S. Cl. ...................... 372/45; 357/17; 372/46
[58] Field of Search ............... 331/94.5 H; 357/16-18; 372/45, 46

[56] References Cited

U.S. PATENT DOCUMENTS 4,233,090 11/1980 Hawrylo et al. ............. 331/94.5 H
4,278,949 7/1981 Marschall et al. ............. 331/94.5 H

FOREIGN PATENT DOCUMENTS 2710183 9/1977 Fed. Rep. of Germany .. 331/94.5 H

OTHER PUBLICATIONS

Casey et al., "Ga As-$Al_xGa_{1-x}$As Heterostructure Laser with Separate Optical and Carrier Confinement," J. Appl. Phys., vol. 45, No. 1, Jan. 1974, pp. 322-333.

Primary Examiner—James W. Davie
Attorney, Agent, or Firm—Spencer & Kaye

[57] ABSTRACT

A semi-conductor laser comprising a crystal having a sequence of layers forming a heterostructure diode and which includes a laser active zone interposed between a pair of semiconductor layers. Each of these semi-conductor layers has a band gap which is greater than that of the layers within the laser active zone. The laser active zone includes a first semiconductor layer having a given band gap, and at least second and third semiconductor layers each having a band gap which is greater than that of the first layer. The first layer is contiguous with and interposed between semiconductor layers each having a band gap which is greater than that of said first layer and forms a pn-junction with one of those contiguous layers. A strip-shaped region of a uniform conductivity type diffused from the surface of the crystal penetrates into at least one layer of the laser active zone but does not penetrate into the first layer.

13 Claims, 7 Drawing Figures

SEMICONDUCTOR LASER

BACKGROUND OF THE INVENTION

The present invention relates to a semiconductor laser having a layer sequence forming a heterostructure diode wherein the laser active zone is interposed between semiconductor layers whose band gaps are greater than the greatest band gap within the laser active zone.

Various requirements must be met by semiconductor lasers if they are to be employed in optical data transmission systems. For example, a semiconductor laser used for this purpose should have a linear light-current characteristic, stable emission without fluctuations and be easy to manufacture.

U.S. application Ser. No. 41,171 filed May 21, 1979 by Marschall et al. now U.S. Pat. No. 4,278,949, discloses an easily manufactured laser which meets the above requirements. In accordance with the teachings of this application, the current flowing in the forward direction of the laser diode is constricted to a narrow, strip-shaped region of the laser active zone by providing a trough-like recess extending perpendicularly to its radiation emitting surface. Through this recess, a narrow semiconductor region of essentially uniform conductivity type and extending to the laser active zone is produced by diffusion of doping material. However, this laser exhibits a multimode spectral emission which constitutes a disadvantage for some applications such as the broadband optical transmission of data.

German Offenlegungsschrift No. 27 10 813 discloses that a single mode spectral emission can be realized in a laser having low threshold current densities by providing external wave guidance which is not only perpendicular but also parallel to the active zone. For this purpose, a strip-shaped current path is produced by diffusion so as to penetrate into the active zone thereby increasing the index of refraction. Although such a laser is easy to manufacture, the diffusion zone extends into the recombination region where it can seriously inhibit laser emission thereby leading to rapid aging of the laser. Also, the single mode spectral emission obtained with this laser, which depends upon the temperature of the laser, is not entirely satisfactory.

It is therefore an object of the present invention to overcome these disadvantages. In particular, a laser is provided which has an improved single mode spectral emission even under conditions in which the temperature of the laser fluctuates. Further, the laser can be manufactured by simple techniques and has a long service life.

SUMMARY OF THE INVENTION

In accordance with the present invention, a semiconductor laser is provided comprising a crystal having a sequence of layers forming a heterostructure diode and which includes a laser active zone interposed between a pair of semiconductor layers. Each of these semiconductor layers has a band gap which is greater than that of the layers within the laser active zone.

The laser active zone includes a first semiconductor layer having a given band gap, and at least second and third semiconductor layers having a band gap which is greater than that of the first layer. The first layer is contiguous with and interposed between semiconductor layers each having a band gap which is greater than that of the first layer and forms a pn-junction with one of those contiguous layers.

A strip-shaped region of a uniform conductivity type diffused from the surface of the crystal penetrates into at least one layer of the laser active zone but does not pentrate into the first layer.

By dividing the laser active zone into at least three layers, such that the layer having the smallest band gap is interposed between layers with greater band gaps and having a pn-junction disposed directly at the layer having the smallest band gap, the charge carriers are recombined. Consequently, laser light is generated essentially only in the layer having the smallest band gap although the optical field is carried in the entire laser active zone which includes at least the first, second and third layers.

Diffusion of the strip-shaped conductivity path does not extend into the first layer having the smallest band gap but ends instead in the preceding layer. As a result, the optical field is laterally guided in the desired manner and the diffused path does not interfere with recombination in the first layer having the smallest band gap generation of the laser wave or the service life of the laser.

In order to restrict the charge carrier recombination essentially to the layer having the smallest band gap, it has been found that the band gap should be less by at least 40 meV than the band gap of the other layers present in the laser active zone. By providing a trough-shaped recess in the surface perpendicular to the radiation emitting surface of the laser and by producing the strip-shaped conductivity path by diffusion through this recess, simple control and monitoring of the width of the interval waveguide and of the width of the current injection during manufacture are assured. In order to realize a spectral emission which is as single-moded as possible, the width of the strip-shaped conductivity path at the junction to the laser active zone is set between 1 and 8$\mu$. If the thickness of the layer having the smallest band gap in the laser active zone is below 0.2$\mu$, the optical field can penetrate into the adjacent layers of the laser active zone in an optimum manner.

DESCRIPTION OF THE PREFERRED EMBODIMENTS

Figure 1:
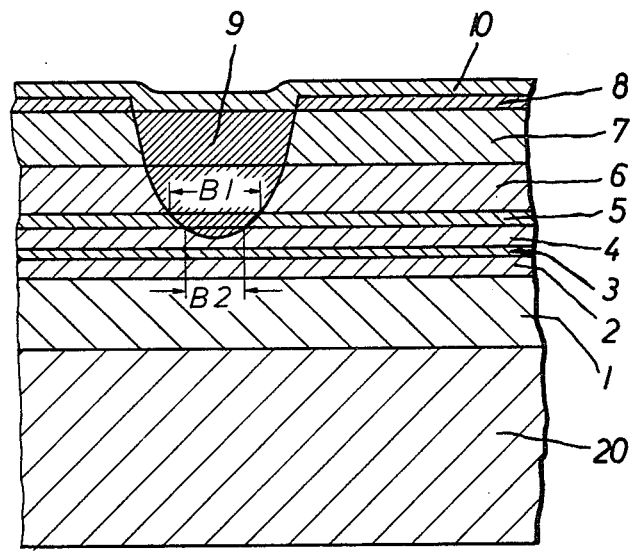
FIG. 1 is a schematic representation of the configuration of a laser according to the invention.

FIG. 1 is a schematic representation of a laser according to the invention. The individual semiconductor layers are identified by the reference numerals 1 to 7, the semiconductor substrate being designated by the reference numeral 20. The laser active zone includes the layers 2 through 5. The semiconductor laser has a layer sequence which corresponds to that of a heterostructure diode wherein the laser active zone is interposed between semiconductor layers 1 and 6, layers 1 and 6 having band gaps which are greater than the greatest band gaps within the laser active zone. At least two layers of the laser active zone differ in their band gap in such a way that the layer having the smallest band gap is surrounded by layers having greater band gaps. Further, a pn-junction is disposed immediately at the layer having the smallest band gap.

The band gaps of layers 1 and 6 are made greater than the greatest band gaps of the layers 2 to 5 in order to restrict the charge carriers to the laser active zone. Since a wide band gap is related to a large refractive index, the laser active zone forms a waveguide perpendicular to the layers thereby restricting the laser field to the laser active zone.

Within the laser active zone, layer 3 has the smallest band gap in order to have recombination of the charge carriers occur mainly in this layer. The difference between the band gap of layer 3 and that of the contiguous layers should significantly exceed the thermal energy, which is about 25 meV at room temperature, to prevent leakage current in these contiguous layers. Therefore the band gap in layer 3 should be at least 40 meV smaller than that of the contiguous layers.

A modification of the band gap in the $Ga_xAl_{1-x}As$-system is easily obtained by modifying the value of x.

A modification of the band gap by 40 meV corresponds to a modification of x of approximately 0.04.

In FIG. 1, layer 3 is the layer having the smallest band gap, the band gaps of layers 2, 4 and 5 being at least 40 meV greater. If the layer 3 is an n-conductive layer, the pn-junction is disposed between layers 4 and 3, otherwise it is between layers 3 and 2 in which case layers 3 and 4 are p-conductive.

As disclosed in German Auslegeschrift No. 21 65 006, subdivision of the laser active zone provides the advantage that the optical wave is conducted throughout the entire laser active zone whereas the recombination of the charge carriers takes place only in layer 3. A strip-shaped conductivity region 9 of a uniform conductivity type is diffused from the surface of the laser crystal so as to penetrate into one or several layers of the laser active zone. For example, in the specific example shown in FIG. 1, the conductivity region penetrates into layers 5 and 4. In order to increase the service life of the laser and to obtain good single-mode emission, the strip-shaped conductivity region 9 does not extend to layer 3.

The diffused strip-shaped conductivity region 9 may be realized by a p diffusion which may, for example be a Zn diffusion. For this purpose, a diffusion inhibiting layer 8 composed of $SiO_2$, $Al_2O_3$ or $Si_3N_4$ is applied onto layer 7 with a strip-shaped opening being left free for the diffusion of the conductivity region 9. Finally, a metallic layer 10 of Ti-Pt-Au is vapor-deposited onto the diffusion inhibiting layer 8 for contacting with the conductivity region 9.

The layer 7 constitutes a p or n-type conductive cover layer for the purpose of establishing contact between the inhibiting layer 8 and the layer 6. Layers 6 and 1 are layers with large band gaps for concentrating the optical field as well as the recombining charge carriers in the laser active zone. Assuming a p-type diffusion for the conductivity region 9 the type of doping is selected as follows:

layer 7: p or n
layer 6: p or n
layer 5: n (highly doped)
layer 4: p
layer 3: p or n
layer 2: n
layer 1: n
substrate 20: n In the area of the conductivity region 9, the n-type conductive layers are converted to p-type conductive layers so that in the narrow region 9 there is produced a narrow strip of uniform conductivity type. In FIG. 1 this is a p-type conductive region which extends from the contact material 10 into the p-type conductive layer 4. The layer 4 has a relatively low doping level so that the conductivity within this layer is poor. The narrowest point of the p conductive, strip-shaped conductivity region is given by the width B2 with which the diffusion front penetrates the interface between layers 5 and 4. The optimum width B2 is on the order of $2\mu$. Current flow outside of the conductivity region 9 is prevented by the blocking pn-junction between layers 4 and 5.

The laser according to the invention is distinguished by the fact that recombination takes place, and thus the laser light is generated, directly below the conductivity region 9 at the p-n junction in the layer 3 and a substantial portion of the laser light is conducted in layer 5.

Figure 2:
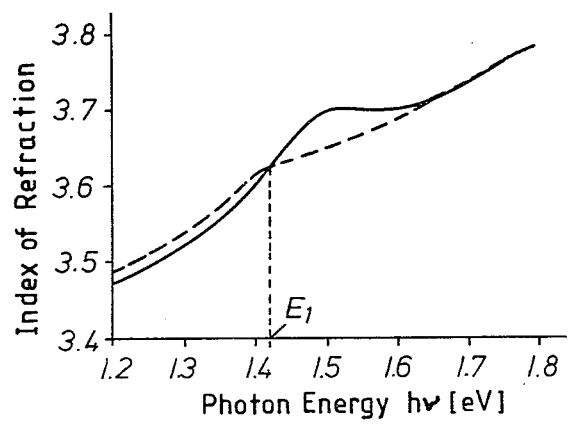
FIG. 2 is a graph showing how the index of refraction of GaAs varies as a function of photon energy.

The reasons for conducting the laser light in layer 5 are as follows:

The p-type diffusion leads to a change in the index of refraction in layer 5. In FIG. 2 the index of refraction is shown by the solid curve for n-doped GaAs having a doping of $3.3 \cdot 10^{18}$ cm$^{-3}$ and by the dashed curve for p-doped GaAs having a compensated doping, net doping of $5 \cdot 10^{18}$ cm$^{-3}$.

In the present invention, layer 5 is not usually composed of GaAs, but, for example, of GaAlAs having a greater band gap so that the actual index of refraction differs from that shown in FIG. 2. However, GaAlAs, like GaAs, exhibits a change in its index of refraction as a result of a change in doping. The dashed curve thus corresponds to the index of refraction of the diffused portion of layer 5, and the solid curve corresponds to the index of refraction of the nondiffused portion of layer 5. The curves of FIG. 2 were taken from the article by D. D. Sell et al., Concentration Dependence of the Refractive Index for n- and p-type GaAs between 1.2 and 1.8 eV, Journal of Applied Physics 45 (1974), pages 2650 to 2657.

From FIG. 2 it follows that the diffused region has a high index of refraction and thus functions as a wave guide only if the photon energy is less than the energy $E_1$, where $E_1$ is somewhat greater than the band gap of the layer 5. In the laser according to the invention, this condition is met since the band gap of layer 5 is selected to be greater than the band gap of layer 3, with the band gap of layer 3 essentially determining the emission wavelength of the laser. Thus, the laser not only exhibits wave guidance in a direction perpendicular to the active zone but also, due to the change in the index of refraction, lateral wave guidance in the area of the strip-shaped conductivity region 9.

The band gaps and the layer thicknesses are determined such that (1) a large proportion of the laser wave passes through layer 3 in order to assure sufficient amplification of the laser wave, and (2) a large proportion of the laser wave passes through layer 5 so as to assure sufficient wave guidance.

EXAMPLE I

Table I shows the material, conductivity types, doping and thicknesses for a typical laser made in accordance with the invention. In order to simplify manufacture, layer 2 has been omitted in this embodiment.

Figure 3:
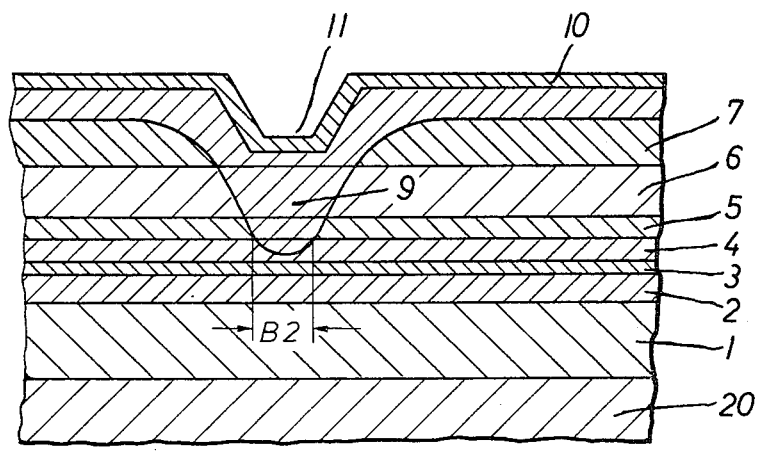
FIG. 3 is a schematic representation of the configuration of a laser according to the invention which employs a trough-shaped recess in its surface.

As indicated in Table I, x and $x^v > x''$, $x'''$ and $x^{iv}$ and $x'' < x'''$. If layer 2 is included, as shown in FIGS. 1 and 3, it is composed of $Ga_{1-x'}Al_{x'}As$ of n-type conductivity where x' has a value of approximately 0.75, the doping level is $5 \cdot 10^{17}$ cm$^{-3}$ and its thickness is 0.5 μm. With respect to the compositions of the other layers x, $x^v > x'$ and $x'' < x'$. This embodiment of the invention emits laser light waves between 0.8 and 0.9μ.

TABLE I

| Layer | Material | Type | Proportion x | Doping cm$^{-3}$ | Thickness μm | Remarks |
|---|---|---|---|---|---|---|
| 20 | GaAs | n | | $n > 10^{18}$ | | Orientation |
| 1 | $Ga_{1-x}Al_xAs$ | n | $x \approx 0.25-0.3$ | $n \approx 5 \cdot 10^{17}$ | $\approx 4$ | $<100>$ |
| 2 | omitted | | | | | |
| 3 | $Ga_{1-x''}Al_{x''}As$ | n or p | $x'' \approx 0.05$ | weak | $\approx 0.15-0.2$ | |
| 4 | $Ga_{1-x'''}Al_{x'''}As$ | p | $x''' \approx 0.15$ | $p \approx 2 \cdot 10^{17}$ | $\approx 0.5$ | |
| 5 | $Ga_{1-x^{iv}}Al_{x^{iv}}As$ | n | $x^{iv} \approx 0.1$ | $n \approx 3 \cdot 10^{18}$ | $\approx 0.5$ | |
| 6 | $Ga_{1-x^v}Al_{x^v}As$ | n or p | $x^v \approx 0.35$ | $n \approx 10^{17}$ or $p \approx 10^{17}$ | $\approx 1$ | |
| 7 | GaAs | n or p | | $n \approx 5 \cdot 10^{17}$ or $p \approx 5 \cdot 10^{17}$ | $\approx 2$ | |

The surface of the laser has a trough-like recess 11 which extends essentially perpendicularly to the exit surface of the laser radiation. The strip-shaped conductivity region 9 is obtained precisely by diffusion through this recess using, for example, the method disclosed in the aforementioned U.S. Pat. No. 4,278,949. The p-diffusion of conductivity region 9 is effected in such a manner that it penetrates the interface between layers 5 and 4 in a strip having a width B2 of about 2μ. Diffusion is facilitated because the diffusion constants in the regions having a high Al content are much greater than in the regions having a lower Al content. Thus, in layers 5 and 4 the diffusion rate is reduced considerably thereby facilitating the setting of a reproduceable diffusion profile. The doping of layer 4 is relatively low to prevent excessive current spread. The thickness of layer 7 may be less than the 2 μm shown in Table I, for example, only 1 μm in thickness, so that the border of the diffused region in layer 6 is located to the side of the trough. The blocking behavior resulting at the side of the trough-shaped recess is thereby improved since the resulting pn-junction at layer 6 has a large band gap. In this layer sequence the first odd wave, which is perpendicular to the layer sequence, has the greatest amplification (high power component in the recombination layer 3) and simultaneously good lateral wave guidance (high power component in layer 5).

Figure 4:
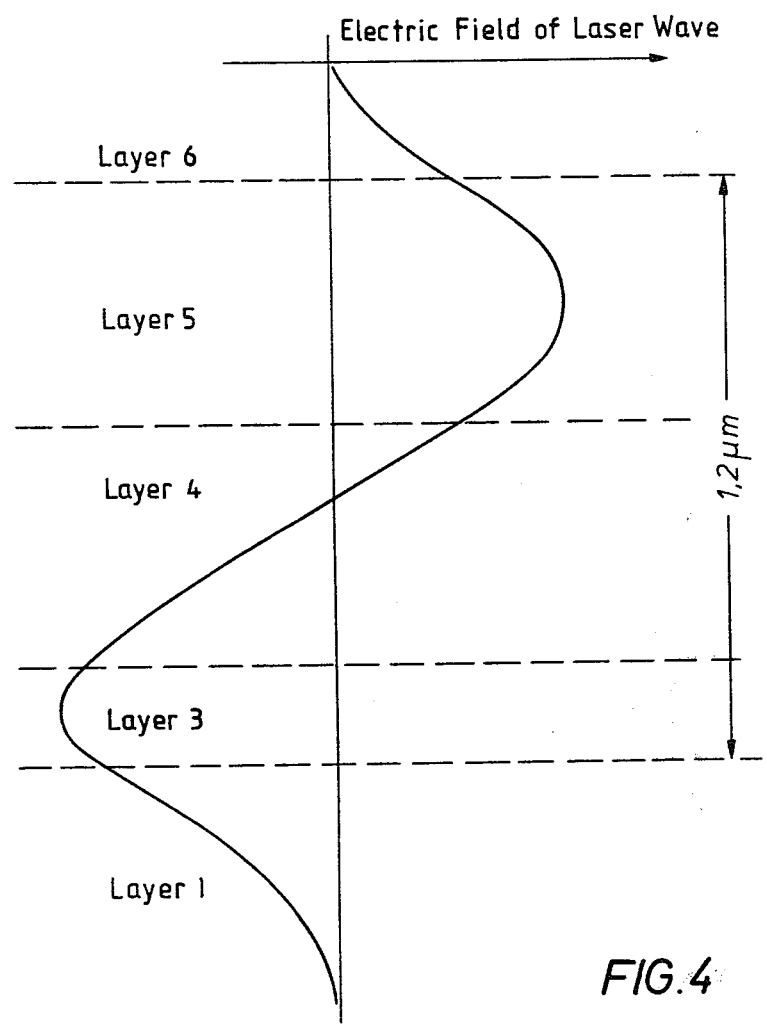
FIG. 4 is a curve of the electric field of the laser wave in a first layer sequence according to the invention.

The curve of the electric field of the laser wave in the individual layers 1 through 6 as shown in FIG. 4. The electric field is greatest in layers 3 and 5 but of opposite direction. When the thickness of recombination layer 3 is of 0.2μ, the power component is 28% in layer 3 and 38% in layer 5.

Figure 5:
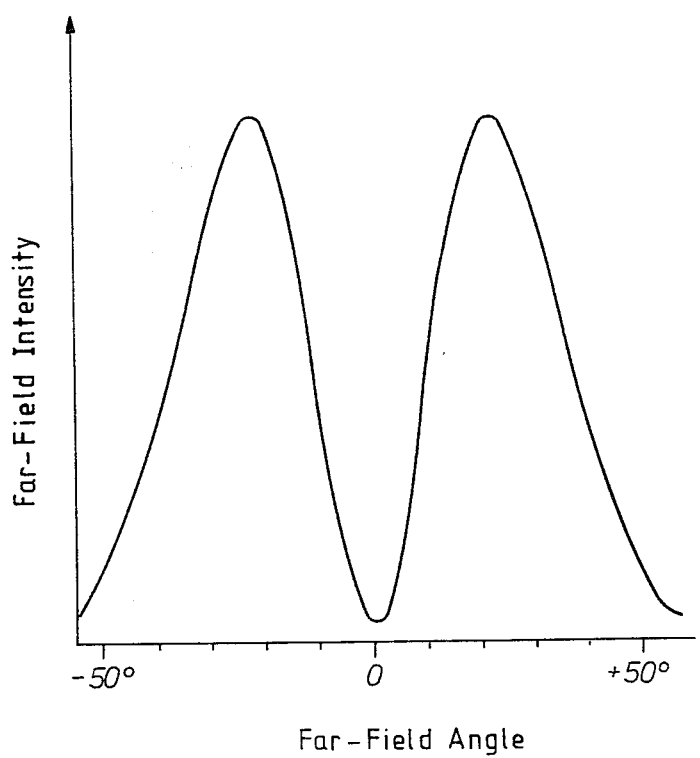
FIG. 5 shows the far-field intensity as a function of the far-field angle for the layer sequence shown in FIG. 4.

The associated far-field perpendicular to the active zone is shown in FIG. 5. Since the wave is an odd wave, the intensity is at a minimum in the axial direction. This may appear to be a disadvantage; however, the minimum intensity in the axial direction reduces the retroactive effect from external reflections into the laser. A high percentage of the laser wave may be coupled into an optical light fiber conductor even with a far-field distribution according to FIG. 5 by employing a cylindrical lens or a transverse fiber to improve coupling.

EXAMPLE II

Lasers according to the invention can also be produced in which only the first even wave oscillates. Table II shows the material, conductivity types, doping and thicknesses for this embodiment wherein the parameters have been selected to obtain controllable diffusion of the conductivity region 9.

Example II differs significantly from Example I in that the thickness of the laser active zone of Example II (layers 3, 4 and 5) is less than that of Example I and the Al content of layer 1 is less.

TABLE II

| Layer | Material | Type | Proportion x | Doping cm$^{-3}$ | Thickness μm | Remarks |
|---|---|---|---|---|---|---|
| 20 | GaAs | n | | $n > 10^{18}$ | | Substrate |
| 1 | $Ga_{1-x}Al_xAs$ | n | $x \approx 0.2$ | $n \approx 10^{18}$ | $\approx 4$ | |
| 2 | omitted | | | | | |
| 3 | $Ga_{1-x''}Al_{x''}As$ | n or p | $x'' \approx 0.05$ | weak | $\approx 0.15$ | |
| 4 | $Ga_{1-x'''}Al_{x'''}As$ | p | $x''' \approx 0.15$ | $p \approx 3 \cdot 10^{17}$ | $\approx 0.3$ | |
| 5 | $Ga_{1-x^{iv}}Al_{x^{iv}}As$ | n | $x^{iv} \approx 0.1$ | $n \approx 3 \cdot 10^{18}$ | $\approx 0.3$ | |
| 6 | $Ga_{1-x^v}Al_{x^v}As$ | n or p | $x^v \approx 0.35$ | $n \approx 10^{17}$ or $p \approx 10^{17}$ | $\approx 1$ | |
| 7 | GaAs | n or p | | $n \approx 5 \cdot 10^{17}$ or $p \approx 5 \cdot 10^{17}$ | $\approx 2$ | |

The AR content of layer 1 has been made less in Example II in order to increase the index of refraction and thus prevent propagation of the first odd wave. A similar effect would be produced by including rather than omitting layer 2.

Figure 6:
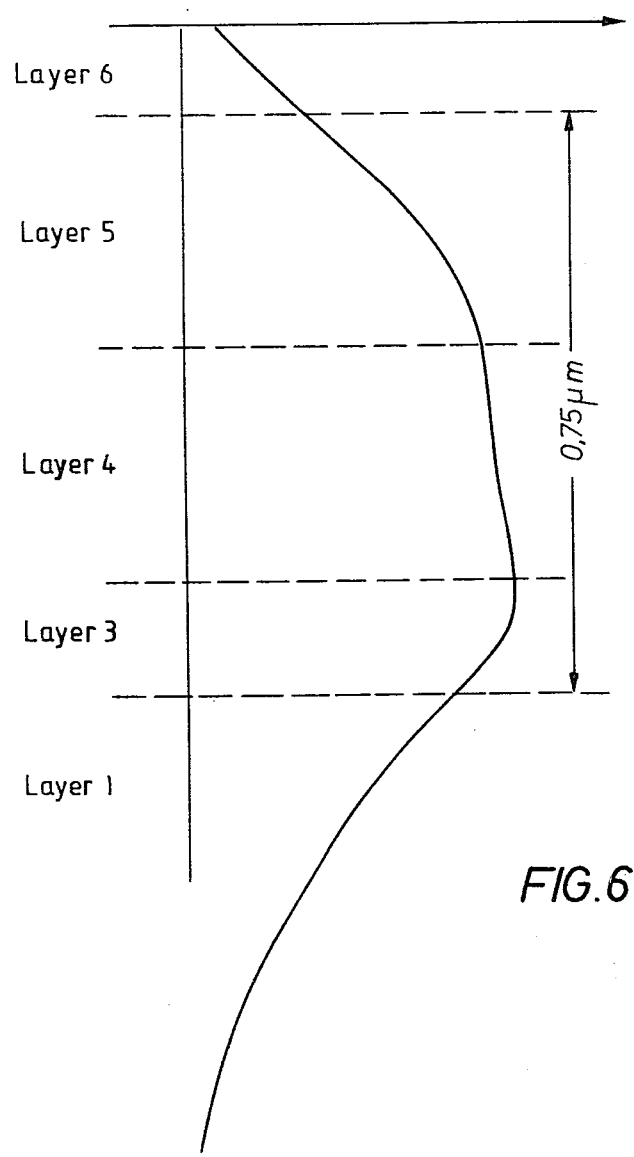
FIG. 6 is a curve of the electric field of the laser wave in a second layer sequence.

In the embodiment of Example II, the electric field of the laser wave perpendicular to the layers is shown by the curve of FIG. 6. The electric field always has the same direction in all of layers 1 through 6 and a broad maximum which extends from layer 5 to layer 1. Layer 5 has 24% of the light output so that effective lateral wave guidance is assured. The recombination layer 3, i.e. the layer having the smallest band gap, has 19% of the light power so that sufficient amplification of the laser wave is assured.

Figure 7:
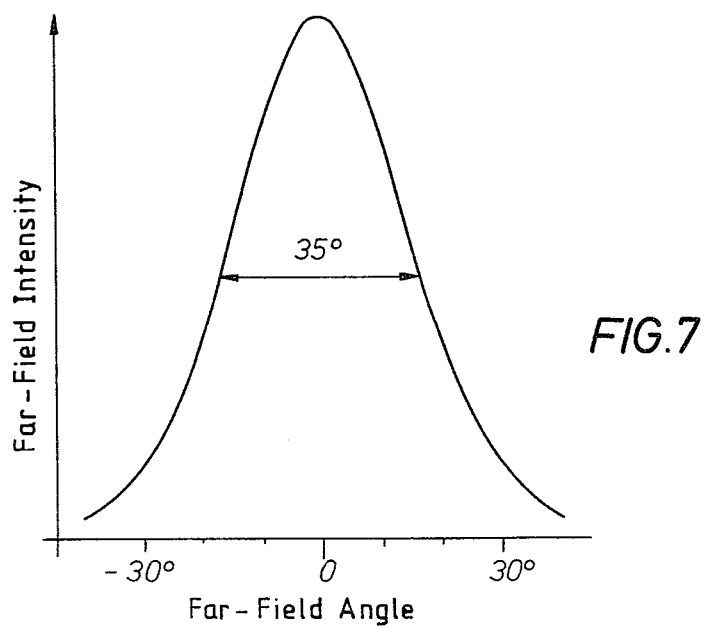
FIG. 7 shows the far-field intensity as a function of the far-field angle for the layer sequence shown in FIG. 6.

The resulting far-field perpendicular to the layers is shown in FIG. 7. In contradistinction to the embodiment of Example I the resulting far-field is narrow with a maximum of about 35° in the axial direction at a far-field angle of zero and a 3 dB bandwidth measured at 50% of the maximum intensity value making it possible to couple the laser light into a glass fiber without difficulty.

EXAMPLE III

Lasers according to the present invention can be fabricated not only with GaAlAs but also with other materials such as GaInAsP, the differences in band gaps and the layer thicknesses being selected as described above. A typical layer sequence for a GaInAsP laser consists of the materials shown in Table III.

TABLE III

| Layer | Material | Conductivity Type |
|---|---|---|
| 20 | InP | n(Substrate) |
| 1 | $Ga_{1-x}In_xAs_{1-y}P_y$ | n |
| 2 | $Ga_{1-x'}In_{x'}As_{1-y'}P_{y'}$ | n |
| 3 | $Ga_{1-x''}In_{x''}As_{1-y''}P_{y''}$ | n or p |
| 4 | $Ga_{1-x'''}In_{x'''}As_{1-y'''}P_{y'''}$ | p |
| 5 | $Ga_{1-x^{iv}}In_{x^{iv}}As_{1-y^{iv}}P_{y^{iv}}$ | n |
| 6 | $Ga_{1-x^v}In_{x^v}As_{1-y^v}P_{y^v}$ | n or p |
| 7 | $Ga_{1-x^{vi}}In_{x^{vi}}As_{1-y^{vi}}P_{y^{vi}}$ | n or p |

In Table III, x, $x^v > x'$, $x''$, $x'''$, $x^{iv}$; $x'' < x'$, $x'''$ and y, y', y'', y''', $y^{iv}$, $y^v$, $y^{v'}$ have been selected such that the lattice constant in the respective layers corresponds to that of InP. That is, the following relationship applies in the respective layers:

$$(1-x/1-y) \approx 0.47$$

In the above examples, layer 7 may be omitted since its function is to provide a better contact between layers 8 and 6. The laser waves generated by the embodiment of Example III are in the range 1.1 to 1.6μ.

According to Table III a specific example for a laser emitting at 1.3 μm is as follows:

| Layer | Proportion y | Doping $cm^{-3}$ | Thickness |
|---|---|---|---|
| 20 | | $n > 10^{18}$ | |
| 1 | y = 0,75 | $n \approx 10^{18}$ | $\approx 3\mu m$ |
| 2 | omitted | | |
| 3 | y'' = 0.4 | weakly n or p | $\approx 0.2\mu m$ |
| 4 | y''' = 0.6 | $p \approx 3 \cdot 10^{17}$ | $\approx 0.5\mu m$ |
| 5 | $y^{iv}$ = 0.5 | $n \approx 3 \cdot 10^{18}$ | $\approx 0.5\mu m$ |
| 6 | $y^v$ = 1 | $n \approx 3 \cdot 10^{17}$ | $\approx 2\mu m$ |
| 7 | $y^{vi}$ = 0.4 | $n \approx 5 \cdot 10^{17}$ | $\approx 3\mu m$ |

The respective In concentrations x, x'', x''', $x^{iv}$, $x^v$, $x^{vi}$ are chosen to meet the formula $(1-x)/(1-y) \approx 0.47$ which is an experimentally found relation to match the lattice constants of the layers 1 to 7 to the lattice constant of the InP substrate. This lattice matching is important to get damage-free growth conditions.

It is to be understood that the above description of the present invention is susceptible to various changes, modifications, and adaptations, and the same are intended to be comprehended within the meaning and range of equivalents of the appended claims.

What is claimed is:

1. In a semiconductor laser consisting of a crystal having a sequence of layers forming a heterostructure diode and including a laser active zone interposed between a pair of semiconductor layers, each having a band gap greater than that of any layer within said laser active zone, the improvement wherein:

said laser active zone includes a first semiconductor layer having a given band gap, and at least second and third semiconductor layers each having a band gap which is greater than that of said first layer, said first layer being contiguous with and interposed between semiconductor layers each having a band gap which is greater than that of said first layer and forming a pn-function with one of said contiguous layers;

said improvement further comprising a strip-shaped region of a uniform conductivity type diffused from the surface of said crystal, said region penetrating into at least one layer of said laser active zone but not into said first layer.

2. A semiconductor laser as defined in claim 1 wherein the difference in band gaps between said first layer and that of the other layers comprising said active zone is at least 40 meV.

3. A semiconductor laser as defined in claim 1 or 2 wherein the surface of said laser is provided with a trough-like recess extending perpendicular to the surface of said laser from which radiation is emitted, said strip-shaped region being obtained by diffusion through said recess.

4. A semiconductor laser as defined in claim 1 or 2 wherein the width of said strip-shaped region at the junction of said active laser zone and the semiconductor region contiguous therewith is between 1 and 8μ.

5. A semiconductor laser as defined in claim 1 or 2 wherein said first layer has a thickness of less than 0.2μ.

6. A semiconductor laser as defined in claim 1 or 2 wherein said strip-shaped region is of p-type conductivity and the second layer of said laser active zone is interposed between the first and third of said active zone, said second layer being p-doped, said third layer being n-doped and said p-type conductivity region extending through said third layer into said second layer, said third layer being converted from n to p-type in that portion thereof through which said p-type conductivity strip-shaped region extends.

7. A semiconductor laser as defined in claim 1 wherein said laser active zone includes four individual layers (2), (3), (4) and (5), the semiconductor layers between which said active region is interposed are individual layers (1) and (6), an individual layer (7) is contiguous with layer (6) and a substrate (20) is contiguous with layer (1), said layers being composed of materials having conductivity types as follows:

| Layer | Material | Conductivity Type |
|---|---|---|
| 20 | GaAs | n(Substrate) |
| 1 | $Ga_{1-x}Al_xAs$ | n |
| 2 | $Ga_{1-x'}Al_{x'}As$ | n |
| 3 | $Ga_{1-x''}Al_{x''}As$ | n or p |
| 4 | $Ga_{1-x'''}Al_{x'''}As$ | p |
| 5 | $Ga_{1-x^{iv}}Al_{x^{iv}}As$ | n |
| 6 | $Ga_{1-x^v}Al_{x^v}As$ | n or p |
| 7 | GaAs | n or p | wherein x, $x^v > x'$, $x''$, $x'''$, $x^{iv}$ and $x'' < x'$, $x'''$, said strip-shaped region having p-type conductivity and extending through layers (6) and (5) into layer (4) thereby converting layers (6) and (5) from n to p-type in that portion thereof through which said p-type conductivity region extends.

8. A semiconductor laser as defined in claim 1 wherein said laser active zone includes four individual layers (2), (3), (4) and (5), the semiconductor layers between which said active region is interposed are individual layers (1) and (6), an individual layer (7) is contiguous with layer (6) and a substrate (20) is contiguous with layer (1), said layers being composed of materials having conductivity types as follows:

| Layer | Material | Conductivity Type |
|---|---|---|
| 20 | InP | n(Substrate) |
| 1 | $Ga_{1-x}In_xAs_{1-y}P_y$ | n |
| 2 | $Ga_{1-x'}In_{x'}As_{1-y'}P_{y'}$ | n |
| 3 | $Ga_{1-x''}In_{x''}As_{1-y''}P_{y''}$ | n or p |
| 4 | $Ga_{1-x'''}In_{x'''}As_{1-y'''}P_{y'''}$ | p |
| 5 | $Ga_{1-x^{iv}}In_{x^{iv}}As_{1-y^{iv}}P_{y^{iv}}$ | n |
| 6 | $Ga_{1-x^v}In_{x^v}As_{1-y^v}P_{y^v}$ | n or p |
| 7 | $Ga_{1-x^{vi}}In_{x^{vi}}As_{1-y^{vi}}P_{y^{vi}}$ | n or p | wherein x, $x^v > x'$, x'', x''', $x^{iv}$; $x'' < x'$, x''' and y, y', y'', y''', $x^{iv}$, $y^v$ and $y^{vi}$ have values such that the lattice constant in the respective layers corresponds to that of InP whereby the relationship $(1-x/1-y) \approx 0.47$ applies in the respective layers.

9. A semiconductor laser as defined in claim 7 or 8 wherein $x^{iv} < x'''$.

10. A semiconductor laser as defined in claim 7 or 8 wherein said layer (5) has an n doping greater than $10^{18}$ cm$^{-3}$.

11. A semiconductor laser as defined in claim 7 or 8 wherein said layer (4) has a p doping of less than $5 \cdot 10^{17}$ cm$^{-3}$.

12. A semiconductor laser as defined in claim 1, 2, 7 or 8 wherein the total thickness of said laser active zone is less than $2\mu$.

13. A semiconductor laser as defined in claim 1 wherein said first layer of said laser active zone is interposed between said second and third layers of said zone.

* * * * *